(12) United States Patent
Iwasaki

(10) Patent No.: US 7,068,713 B2
(45) Date of Patent: Jun. 27, 2006

(54) DIGITAL FILTER CIRCUIT

(75) Inventor: Motoya Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 749 days.

(21) Appl. No.: 10/206,673

(22) Filed: Jul. 29, 2002

(65) Prior Publication Data

US 2003/0033337 A1    Feb. 13, 2003

(30) Foreign Application Priority Data

Aug. 3, 2001    (JP)    ............................. 2001-236697

(51) Int. Cl.
*H03K 5/159* (2006.01)
*H04B 1/10* (2006.01)

(52) U.S. Cl. ..................................... 375/232; 375/350
(58) Field of Classification Search ........ 375/229–236, 375/350; 708/323; 341/144, 155
See application file for complete search history.

(56) References Cited

U.S. PATENT DOCUMENTS

| | | | | |
|---|---|---|---|---|
| 4,775,851 A | * | 10/1988 | Borth | .......................... 341/155 |
| 4,961,206 A | * | 10/1990 | Tomlinson et al. | .......... 375/261 |
| 5,057,914 A | * | 10/1991 | Tsuji et al. | .................. 358/530 |
| 5,838,725 A | | 11/1998 | Gurusami et al. | |

FOREIGN PATENT DOCUMENTS

| | | |
|---|---|---|
| DE | 19919367 A1 | 12/2000 |
| EP | 0 476 215 A1 * | 3/1992 |
| EP | 1113580 A1 | 7/2001 |
| JP | 61-171215 A | 8/1986 |
| JP | 62-295506 A | 12/1987 |
| JP | 63-69310 A | 3/1988 |
| JP | 4-100403 A | 4/1992 |
| JP | 6-104694 A | 4/1994 |
| WO | WO 00/62421 A1 | 10/2000 |

OTHER PUBLICATIONS

Kam Van Der, JJ: "A Digital Decimating Filter for Analog-to-digital Conversion of Hi-Fi Audio Signals" Philips Technisch Tudschrift, Natuurkundig Laboratorium Der N.V. Philips. Eindhoven, NL, vol. 42, No. 6/7, Apr. 1986, pp. 230-238, XP002187797.

* cited by examiner

*Primary Examiner*—Don N. Vo
(74) *Attorney, Agent, or Firm*—Sughrue Mion, PLLC

(57) ABSTRACT

A digital filter circuit includes a decoder, ROM tables, multipliers, and an adder. The decoder decomposes an input multilevel signal into a plurality of 1-bit signals. The ROM tables output filter waveforms stored in advance, on the basis of the 1-bit signals output from the decoder. The multipliers and adder execute a plurality of weighting operations for the respective bits of outputs from the ROM tables and then add the outputs.

7 Claims, 2 Drawing Sheets

DIGITAL FILTER CIRCUIT

BACKGROUND OF THE INVENTION

The present invention relates to a ROM (Read Only Memory) table lookup digital filter circuit which uses a ROM table for a multilevel input signal.

Along with the recent proliferation of CDMA (Code Division Multiple Access), it is becoming impossible to use, as transmission digital filters, ROM lookup filters that are used in radio devices for mainstream SCPC (Single Channel Per Carrier system) or TDMA (Time Division Multiple Access). For this reason, a demand has arisen for implementation of an alternative digital filtering method with a small circuit scale.

FIG. 2 shows a digital filter circuit of the first prior art. Referring to FIG. 2, a shift register 21 temporarily stores input 1-bit transmission data and outputs it to a ROM table 23. A counter 22 counts input sample clocks and outputs the obtained count value to the ROM table 23. The ROM table 23 outputs a filter output waveform, which is stored in advance and corresponds to the input data sequence, on the basis of the outputs from the shift register 21 and counter 22. This prior-art digital filter circuit is disclosed in Japanese Patent Laid-Open No. 63-69310.

FIG. 3 shows a digital filter circuit of the second prior art. Referring to FIG. 3, a shift register 31 serially receives transmission data of a plurality of bits and parallelly outputs the bit signals to multipliers 33-1 to 33-n. A counter 32 counts input sample clocks and outputs TAP coefficients corresponding to the count value to the multipliers 33-1 to 33-n. The multipliers 33-1 to 33-n weight the respective bit signals of the parallel outputs from the shift register 31 using the TAP coefficients and then outputs the bit signals to an adder 34.

In a conventional digital filter circuit, when the ROM table lookup filter shown in FIG. 2 is used, a digital filter circuit can easily be constituted. Generally, however, no ROM table lookup filter can be used for a multilevel signal containing a plurality of input bits. Hence, the normal FIR (Finite Impulse Response) filter is normally used. However, since this circuit requires a number of multipliers, the circuit scale becomes large.

SUMMARY OF THE INVENTION

It is an object of the present invention to provide a ROM table lookup digital filter circuit capable of processing a multilevel signal containing a plurality of bits.

In order to achieve the above object, according to the present invention, there is provided a digital filter circuit comprising decoding means for decomposing an input multilevel signal into a plurality of 1-bit signals, a plurality of ROM tables which output filter waveforms stored in advance, on the basis of the 1-bit signals output from the decoding means, and weighting and addition means for executing a plurality of weighting operations for respective bits of outputs from the ROM tables and then adding the outputs.

DESCRIPTION OF THE PREFERRED EMBODIMENT

The present invention will be described below in detail with reference to the accompanying drawings.

Figure 1:
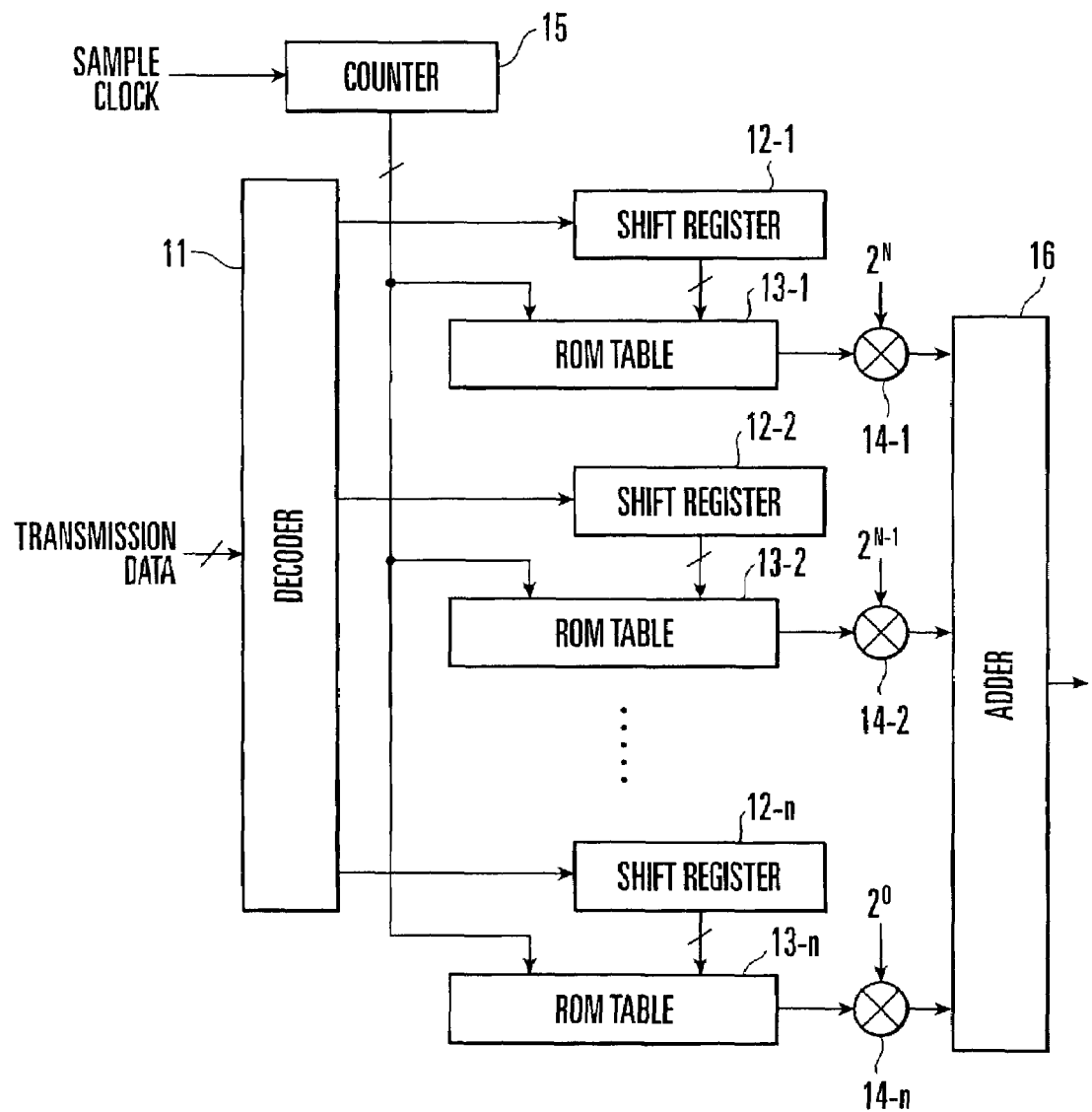
FIG. 1 is a block diagram of a digital filter circuit according to an embodiment of the present invention.
Figure 2:
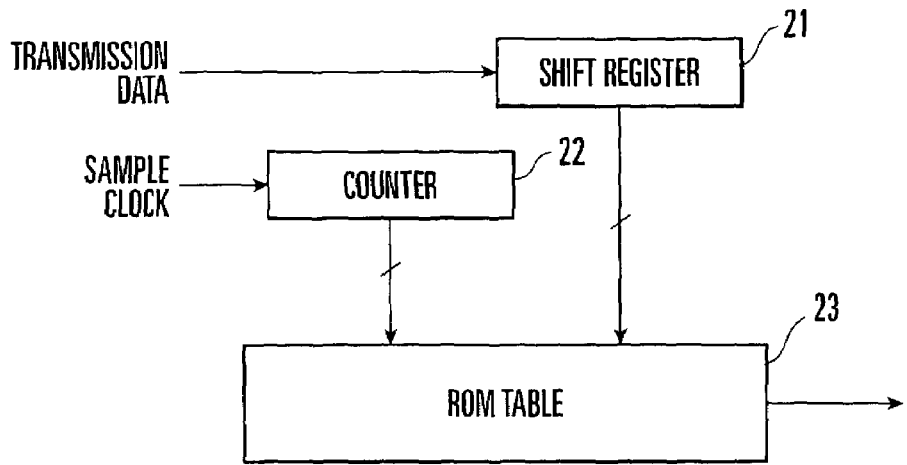
FIG. 2 is a block diagram of a digital filter circuit of the first prior art.
Figure 3:
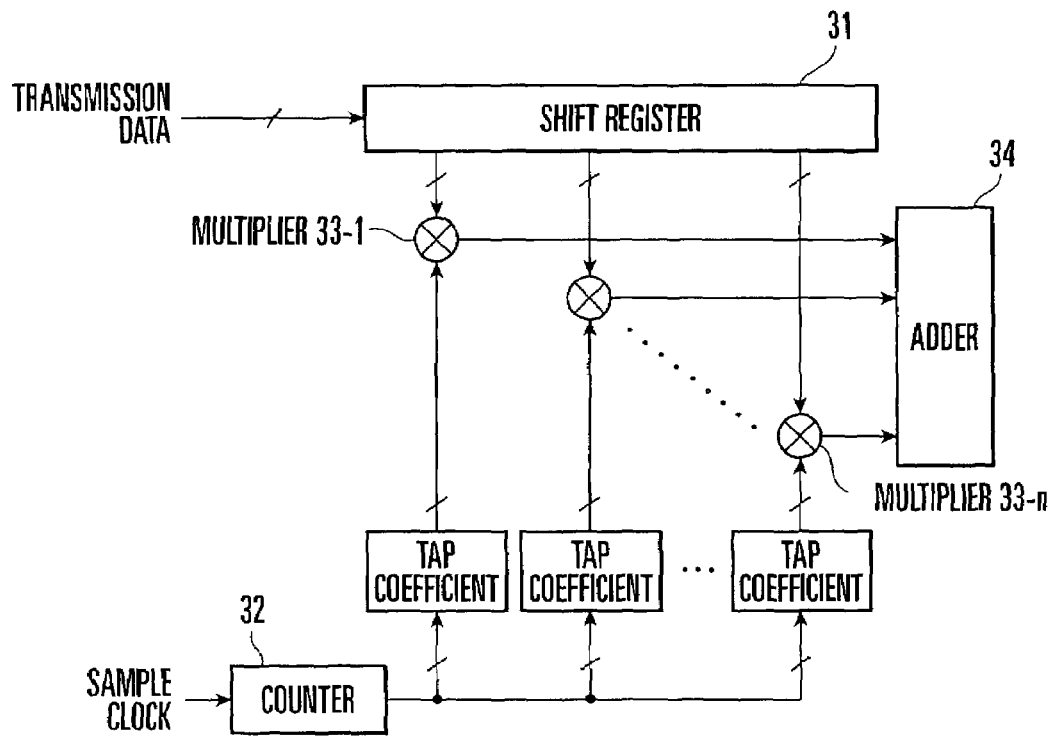
FIG. 3 is a block diagram of a digital filter circuit of the second prior art.

FIG. 1 shows a digital filter circuit according to an embodiment of the present invention. Referring to FIG. 1, a decoder 11 decomposes an input multilevel signal containing a plurality of bits into a plurality of 1-bit signals and outputs the 1-bit signals to shift registers 12-1, 12-2, . . . , 12-n. The shift registers 12-1, 12-2, . . . , 12-n serial/parallel-convert the 1-bit signals from the decoder 11 and output the 1-bit signals to ROM tables 13-1, 13-2, . . . , 13-n, respectively. A counter 15 counts sample clocks and outputs the count value to the ROM tables 13-1, 13-2, . . . , 13-n.

The ROM tables 13-1, 13-2, . . . , 13-n output filter output waveforms, which are stored in advance and correspond to the input data sequence, to multipliers 14-1, 14-2, . . . , 14-n, respectively, on the basis of the outputs from the shift registers 12-1, 12-2, . . . , 12-n and the outputs from the counter 15. The multipliers 14-1, 14-2, . . . , 14-n weight the respective bits of the outputs from the ROM tables 13-1, 13-2, . . . , 13-n by $2^N$, $2^{N-1}$, . . . , $2^0$ (=1), respectively, in correspondence with the bit outputs from the decoder 11 and output the bit signals to an adder 16. The adder 16 adds and outputs the outputs from the multipliers 14-1, 14-2, . . . , 14-n.

The operation of the digital filter circuit having the above arrangement will be described next. A digital filter which receives a multilevel signal, in which a ROM table lookup filter receives a multilevel signal containing a plurality of bits, will be described. The input multilevel signal is decomposed into a plurality of 1-bit signals by the decoder 11. The 1-bit signals are input to the ROM tables 13-1, 13-2, . . . , 13-n through the shift registers 12-1, 12-2, . . . , 12-n.

In the ROM tables 13-1, 13-2, . . . , 13-n, outputs that are preset and correspond to the input data sequences are read out on the basis of the outputs from the shift registers 12-1, 12-2, . . . , 12-n and the outputs from the counter 15. The respective bits of the outputs from the ROM tables 13-1, 13-2, . . . , 13-n are weighted by the multipliers 14-1, 14-2, . . . , 14-n and added by and output from the adder 16.

The multilevel signal sequence containing a plurality of bits that construct input transmission data is decomposed by the decoder 11 into binary signal sequences formed from 1-bit signals of N sequence. Let R be the value of the input signal, and Dn be the nth signal obtained by the decomposition. The input signal sequence is so decomposed as to satisfy $$R = \sum_{n=0}^{N=1} 2^n \cdot D_n \qquad (1)$$

Outputs Fn from the ROM tables 13-1, 13-2, . . . , 13-n are weighted by the multipliers 14-1, 14-2, . . . , 14-in in accordance with equation (2) below and added by and output from the adder 16.

$$G = \sum_{n=0}^{N=1} 2^n \cdot F_n \quad (2)$$

where G is the output from the adder 16.

The input signal R of equation (1) may be decoded to the nth signal Dn so as to satisfy Dn=±1. For example, in decoding an input signal $2^6$ into 8 bits, when decomposition is executed such that $2^6=2^7-2^6+2^5-2^4-2^3-2^2-2^1-2^0$, the signal is decoded to $D^7=+1$, $D^6=-1$, $D^5=+1$, $D^4=-1$, $D^3=-1$, $D^2=-1$, $D^1=-1$, and $D^1=-1$. In this case, a table used in a normal ROM lookup filter can be directly used as the data table of each ROM table.

In addition, in decoding the input signal R to the nth signal Dn using equation (1), the input signal R may be expressed by offset binary data. Each bit of the binary signal may be decoded to obtain a signal sequence. In this case, a ROM table corresponding to an input value "+1" or "0" may be used.

In this method, the input signal R is expressed by offset binary data, and each bit of the offset binary signal is used as a signal sequence obtained by decoding. However, the data table of the ROM table is different from that of a normal ROM lookup filter. A normal ROM lookup filter always processes an input value as "+1" or "−1". Hence, a table is prepared as convolution of an impulse response for an input signal sequence having a value "+1" or "−1". In the method of the present invention, however, since an input value is "+1" or "0", a corresponding table must be prepared.

As has been described above, according to the present invention, a ROM table can be used even for a multilevel input signal. For this reason, the circuit scale can be greatly reduced as compared to a conventional FIR filter.

What is claimed is:

1. A digital filter circuit comprising:
   decoding means for decomposing an input multilevel signal into a plurality of 1-bit signals;
   a plurality of ROM tables which output filter waveforms stored in advance, on the basis of the 1-bit signals output from said decoding means; and
   weighting and addition means for executing a plurality of weighting operations for respective bits of outputs from said ROM tables and then adding the outputs.

2. A circuit according to claim 1, wherein letting R be an input signal and Dn be an nth signal obtained by decomposition when an input multilevel signal sequence containing a plurality of bits is decomposed into binary signal sequences formed from 1-bit signals of N sequence, said decoding means performs decomposing operation so as to satisfy $$R = \sum_{n=0}^{N=1} 2^n \cdot D_n.$$

3. A circuit according to claim 2, wherein letting G be an output from said weighting and addition means and Fn be the output from said ROM table in correspondence with each signal sequence obtained by decomposition, said weighting and addition means performs weighting and adding operation in accordance with $$G = \sum_{n=0}^{N=1} 2^n \cdot F_n.$$

4. A circuit according to claim 2, wherein in decoding the input signal R into the nth signal Dn, said decoding means decodes the input signal R so as to satisfy Dn=±1.

5. A circuit according to claim 2, wherein
   in decoding the input signal R to the nth signal Dn, said decoding means expresses the input signal R by offset binary data and outputs a signal sequence obtained by decoding each bit of the binary data, and
   said ROM table corresponds to an input value "+1" or "0".

6. A circuit according to claim 1, wherein said weighting and addition means comprises
   multipliers which multiply the outputs from said ROM tables by weighting signals for respective bits, and
   an adder which adds outputs from said multipliers.

7. A digital filter circuit comprising:
   a decoder which decomposes an input multilevel signal containing a plurality of bits into 1-bit signals and outputs the 1-bit signals;
   a plurality of shift registers which receives the 1-bit signals from said decoder;
   a counter which counts input sample clocks and outputs count values;
   a plurality of ROM tables which output filter waveforms that are stored in advance and correspond to input data sequences on the basis of the outputs from said shift registers and counter;
   multipliers which weight respective bits of outputs from said ROM tables in correspondence with the bit outputs from said decoder; and
   an adder which adds the outputs from said multipliers.

* * * * *